(12) United States Patent
Ichiki et al.

(10) Patent No.: US 7,839,114 B2
(45) Date of Patent: Nov. 23, 2010

(54) PHASE DETECTION METHOD, PHASE DETECTING APPARATUS, SYNCHRONOUS-MOTOR CONTROL METHOD, AND SYNCHRONOUS MOTOR CONTROLLER

(75) Inventors: Satoshi Ichiki, Kanagawa (JP); Naoki Kawaguchi, Kanagawa (JP)

(73) Assignee: Fujitsu General Limited, Kanagawa (JP)

( * ) Notice: Subject to any disclaimer, the term of this patent is extended or adjusted under 35 U.S.C. 154(b) by 314 days.

(21) Appl. No.: 12/010,021

(22) Filed: Jan. 18, 2008

(65) Prior Publication Data

US 2008/0191657 A1   Aug. 14, 2008

(30) Foreign Application Priority Data

Feb. 8, 2007   (JP)   ............... 2007-029620

(51) Int. Cl.
*H02P 27/00* (2006.01)
(52) U.S. Cl. .................. 318/727; 318/721
(58) Field of Classification Search ........... 318/701, 318/721, 727, 461, 800, 801
See application file for complete search history.

(56) References Cited

U.S. PATENT DOCUMENTS

| | | | |
|---|---|---|---|
| 4,328,454 A * | 5/1982 | Okuyama et al. | 318/803 |
| 6,288,507 B1 * | 9/2001 | Makino et al. | 318/293 |
| 6,501,243 B1 * | 12/2002 | Kaneko et al. | 318/700 |
| 2003/0020429 A1 * | 1/2003 | Masaki et al. | 318/727 |
| 2004/0145334 A1 * | 7/2004 | Virtanen | 318/712 |

FOREIGN PATENT DOCUMENTS

| JP | 5-236789 | 9/1993 |
|---|---|---|
| JP | 2004-336876 | 11/2004 |
| JP | 2006-223085 | 8/2006 |

* cited by examiner

*Primary Examiner*—Rina I Duda
(74) *Attorney, Agent, or Firm*—McDermott Will & Emery LLP

(57) ABSTRACT

It is determined which of six continuous sections having different magnitude correlation of signal amplitude of each phase of an input three-phase signal a section is. Predetermined subtraction is performed between respective phases in the section, to obtain a normalized amplitude value normalized in the section, using the subtraction result. The normalized amplitude value is converted to a vector phase for one cycle based on a predetermined phase and output corresponding to the determined section.

12 Claims, 16 Drawing Sheets

FIG.3A

| TRUE VALUE | NORMALIZED VALUE | CONVERTED PHASE VALUE | ERROR |
|---|---|---|---|
| 30 | 0.00 | 30.00 | 0.00 |
| 31 | 0.02 | 31.20 | -0.20 |
| 32 | 0.04 | 32.37 | -0.37 |
| 33 | 0.06 | 33.52 | -0.52 |
| 34 | 0.08 | 34.66 | -0.66 |
| 35 | 0.10 | 35.77 | -0.77 |
| 36 | 0.11 | 36.87 | -0.87 |
| 37 | 0.13 | 37.94 | -0.94 |
| 38 | 0.15 | 39.01 | -1.01 |
| 39 | 0.17 | 40.05 | -1.05 |
| 40 | 0.18 | 41.09 | -1.09 |
| 41 | 0.20 | 42.11 | -1.11 |
| 42 | 0.22 | 43.12 | -1.12 |
| 43 | 0.24 | 44.11 | -1.11 |
| 44 | 0.25 | 45.10 | -1.10 |
| 45 | 0.27 | 46.08 | -1.08 |
| 46 | 0.28 | 47.04 | -1.04 |
| 47 | 0.30 | 48.00 | -1.00 |
| 48 | 0.32 | 48.96 | -0.96 |
| 49 | 0.33 | 49.90 | -0.90 |
| 50 | 0.35 | 50.84 | -0.84 |
| 51 | 0.36 | 51.77 | -0.77 |
| 52 | 0.38 | 52.70 | -0.70 |
| 53 | 0.39 | 53.62 | -0.62 |
| 54 | 0.41 | 54.54 | -0.54 |
| 55 | 0.42 | 55.45 | -0.45 |
| 56 | 0.44 | 56.37 | -0.37 |
| 57 | 0.45 | 57.28 | -0.28 |
| 58 | 0.47 | 58.19 | -0.19 |
| 59 | 0.48 | 59.09 | -0.09 |
| 60 | 0.50 | 60.00 | 0.00 |

FIG.3B

| TRUE VALUE | NORMALIZED VALUE | CONVERTED PHASE VALUE | ERROR |
|---|---|---|---|
| 61 | 0.52 | 60.91 | 0.09 |
| 62 | 0.53 | 61.81 | 0.19 |
| 63 | 0.55 | 62.72 | 0.28 |
| 64 | 0.56 | 63.63 | 0.37 |
| 65 | 0.58 | 64.55 | 0.45 |
| 66 | 0.59 | 65.46 | 0.54 |
| 67 | 0.61 | 66.38 | 0.62 |
| 68 | 0.62 | 67.30 | 0.70 |
| 69 | 0.64 | 68.23 | 0.77 |
| 70 | 0.65 | 69.16 | 0.84 |
| 71 | 0.67 | 70.10 | 0.90 |
| 72 | 0.68 | 71.04 | 0.96 |
| 73 | 0.70 | 72.00 | 1.00 |
| 74 | 0.72 | 72.96 | 1.04 |
| 75 | 0.73 | 73.92 | 1.08 |
| 76 | 0.75 | 74.90 | 1.10 |
| 77 | 0.76 | 75.89 | 1.11 |
| 78 | 0.78 | 76.88 | 1.12 |
| 79 | 0.80 | 77.89 | 1.11 |
| 80 | 0.82 | 78.91 | 1.09 |
| 81 | 0.83 | 79.95 | 1.05 |
| 82 | 0.85 | 80.99 | 1.01 |
| 83 | 0.87 | 82.06 | 0.94 |
| 84 | 0.89 | 83.13 | 0.87 |
| 85 | 0.90 | 84.23 | 0.77 |
| 86 | 0.92 | 85.34 | 0.66 |
| 87 | 0.94 | 86.48 | 0.52 |
| 88 | 0.96 | 87.63 | 0.37 |
| 89 | 0.98 | 88.80 | 0.20 |
| 90 | 1.00 | 90.00 | 0.00 |

PHASE DETECTION METHOD, PHASE DETECTING APPARATUS, SYNCHRONOUS-MOTOR CONTROL METHOD, AND SYNCHRONOUS MOTOR CONTROLLER

BACKGROUND OF THE INVENTION

1. Field of the Invention

The present invention relates to a phase detection method and a phase detecting apparatus capable of detecting phases of a plurality of phase signals on a real time basis, and also to a control method and a synchronous motor controller for performing sensorless synchronous control of the synchronous motor using the same.

2. Description of the Related Art

A typical synchronous motor controller includes an alternating current detector that detects electric current of a motor provided in one of feed lines from an inverter circuit to the motor, a motor-current-phase detector that detects a motor current phase on the basis of a motor voltage phase at the time of zero crossing of the current, and a calculating unit that calculates a voltage command or frequency command of the inverter circuit so that the motor current phase is same as a desired motor current phase. The inverter circuit is then controlled based on the calculation result. A conventional synchronous motor controller has been disclosed in Japanese Patent Application Laid-open No. H5-236789.

Moreover, technique of sensorless synchronous control of the synchronous motor is available. For example, in the method disclosed in Japanese Patent Application Laid-open No. 2006-223085, the position of a rotor is estimated based on a voltage equation for the motor. In this method, however, a highly accurate motor constant is required, and complicated control needs to be performed.

In the technique disclosed in Japanese Patent Application Laid-open No. H5-236789, a phase difference between the motor current phase and the motor voltage phase is detected at the time of zero-crossing of current, i.e., phase detection is performed for every 180°. Phase detection for every 180°, however, leads to poor detection accuracy, moreover it is not possible to detect instantaneous phase.

Generally, when the phase difference is detected on the real time basis, a three-phase signal is converted to a two-phase signal to obtain a vector phase. For example, when three-phase to two-phase conversion is performed with respect to the three-phase signal shown in the upper part of FIG. 1, waveforms of a real axis component and an imaginary axis component are obtained as shown in the upper part of FIG. 4. When arctan transform is performed using the real axis component and the imaginary axis component, as shown in the lower part of FIG. 4, a vector phase is obtained. In this conventional method, however, processing to obtain the detection result is complicated, and when phase detection is performed on the real time basis, a device having a large computing capacity is required.

Japanese Patent Application Laid-open No. 2004-336876 discloses a technique with which it is possible to detect the phase at an arbitrary timing. Even this method is a method for detecting discrete instantaneous phase, and therefore the detection accuracy is poor and phase detection cannot be performed on the real time basis.

SUMMARY OF THE INVENTION

It is an object of the present invention to at least partially solve the problems in the conventional technology.

According to an aspect of the present invention, there is provided a phase detection method including determining which of a plurality of continuous sections having different magnitude correlation of signal amplitude of each phase a section is, based on an input signal amplitude value of a plurality of phases; normalizing including performing predetermined subtraction with respect to the signal amplitude between respective phases for each section determined at the determining, to obtain a normalized amplitude value normalized in the section, using the subtraction result; and outputting including converting the normalized amplitude value obtained at the normalizing to a vector phase for one cycle based on a predetermined phase, and outputting the vector phase corresponding to the section determined at the determining.

According to another aspect of the present invention, there is provided a phase detection method including determining which of six continuous sections, first to sixth sections, in which magnitude correlation of a signal amplitude value of an input three-phase signal of R-phase, S-phase, and T-phase takes a R-phase value>T-phase value>S-phase value, a R-phase value>S-phase value>T-phase value, a S-phase value>R-phase value>T-phase value, a S-phase value>T-phase value>R-phase value, a T-phase value>S-phase value>R-phase value, and a T-phase value>R-phase value>S-phase value, the section is; calculating the first section by ((R-phase value)−(T-phase value))/((R-phase value)−(S-phase value)), the second section by ((S-phase value)−(T-phase value))/((R-phase value)−(T-phase value)), the third section by ((S-phase value)−(R-phase value))/((S-phase value)−(T-phase value)), the fourth section by ((T-phase value)−(R-phase value))/((S-phase value)−(R-phase value)), the fifth section by ((T-phase value)−(S-phase value))/((T-phase value)−(R-phase value)), the sixth section by ((R-phase value)−(S-phase value))/((T-phase value)−(S-phase value)), to obtain a normalized amplitude value normalized in each section; and second outputting including multiplying the normalized amplitude value of the first to the sixth sections, respectively, by a phase of 60°, to calculate a phase value by adding phases of 30°, 90°, 150°, 210°, 270°, and 330°, respectively, to the multiplied values of the first to the sixth sections, and when the phase value of the sixth section is equal to or larger than 360°, obtaining a phase value by subtracting the phase of 360° from the phase value, and outputting a vector phase for one cycle.

According to still another aspect of the present invention, there is provided a phase detecting apparatus including a section determining unit that determines which of a plurality of continuous sections having different magnitude correlation of signal amplitude of each phase a section is, based on an input signal amplitude value of a plurality of phases; an amplitude normalizing unit that performs predetermined subtraction with respect to the signal amplitude between respective phases for each section determined by the section determining unit, to obtain a normalized amplitude value normalized in the section, using the subtraction result; and a phase outputting unit that converts the normalized amplitude value obtained by the amplitude normalizing unit to a vector phase for one cycle based on a predetermined phase, and outputs the vector phase corresponding to the section determined by the section determining unit.

According to still another aspect of the present invention, there is provided a phase detecting apparatus including a section determining unit that determines which of six continuous sections, first to sixth sections, in which magnitude correlation of a signal amplitude value of an input three-phase signal of R-phase, S-phase, and T-phase takes a R-phase value>T-phase value>S-phase value, a R-phase value>S-phase value>T-phase value, a S-phase value>R-phase value>T-phase value, a S-phase value>T-phase value>R-phase value, a T-phase value>S-phase value>R-phase value, and a T-phase value>R-phase value>S-phase value, the section is; an amplitude normalizing unit that calculates the first section by ((R-phase value)−(T-phase value))/((R-phase value)−(S-phase value)), the second section by ((S-phase value)−(T-phase value))/((R-phase value)−(T-phase value)), the third section by ((S-phase value)−(R-phase value))/((S-phase value)−(T-phase value)), the fourth section by ((T-phase value)−(R-phase value))/((S-phase value)−(R-phase value)), the fifth section by ((T-phase value)−(S-phase value))/((T-phase value)−(R-phase value)), the sixth section by ((R-phase value)−(S-phase value))/((T-phase value)−(S-phase value)), to obtain a normalized amplitude value normalized in each section; and a phase outputting unit that multiplies the normalized amplitude value of the first to the sixth sections, respectively, by a phase of 60°, to calculate a phase value by adding phases of 30°, 90°, 150°, 210°, 270°, and 330°, respectively, to the multiplied values of the first to the sixth sections, and when the phase value of the sixth section is equal to or larger than 360°, obtains a phase value by subtracting the phase of 360° from the phase value, and outputs a vector phase for one cycle.

According to still another aspect of the present invention, there is provided a synchronous-motor control method including calculating a voltage vector phase and a current vector phase to be applied to the synchronous motor based on the above phase detection method, to calculate a power factor, which is a phase difference between the voltage vector phase and the current vector phase on a real time basis; and controlling the synchronous motor based on the power factor.

According to still another aspect of the present invention, there is provided a synchronous motor controller including a voltage phase detector that acquires a vector phase of voltage to be applied to a synchronous motor by the above phase detecting apparatus; a current phase detector that obtains a vector phase of current to be applied to the synchronous motor by the above phase detecting apparatus; a power factor calculator that calculates a power factor, which is a phase difference between the voltage vector phase detected by the voltage phase detector and the current vector phase detected by the current phase detector, on a real time basis; and a control unit that performs synchronous control on the synchronous motor based on the power factor obtained by the power factor calculator.

According to still another aspect of the present invention, there is provided a synchronous motor controller including a current phase detector that acquires a vector phase of current to be applied to the synchronous motor by the above phase detecting apparatus; a power factor calculator that calculates a power factor, which is a phase difference between a voltage vector phase and the current vector phase detected by the current phase detector, on a real time basis; and a control unit that performs synchronous control with respect to the synchronous motor based on the power factor obtained by the power factor calculator. The voltage vector phase to be input to the power factor calculator is controlled by the control unit, so that the phase is a phase of a voltage drive signal for generating an AC signal to be applied to the synchronous motor.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 3A and 3B depict a relationship between a phase and an error detected by the phase detection method according to the first embodiment;

DETAILED DESCRIPTION OF THE PREFERRED EMBODIMENTS

Exemplary embodiments of the present invention will be explained below in detail with reference to the accompanying drawings.

Figure 1:
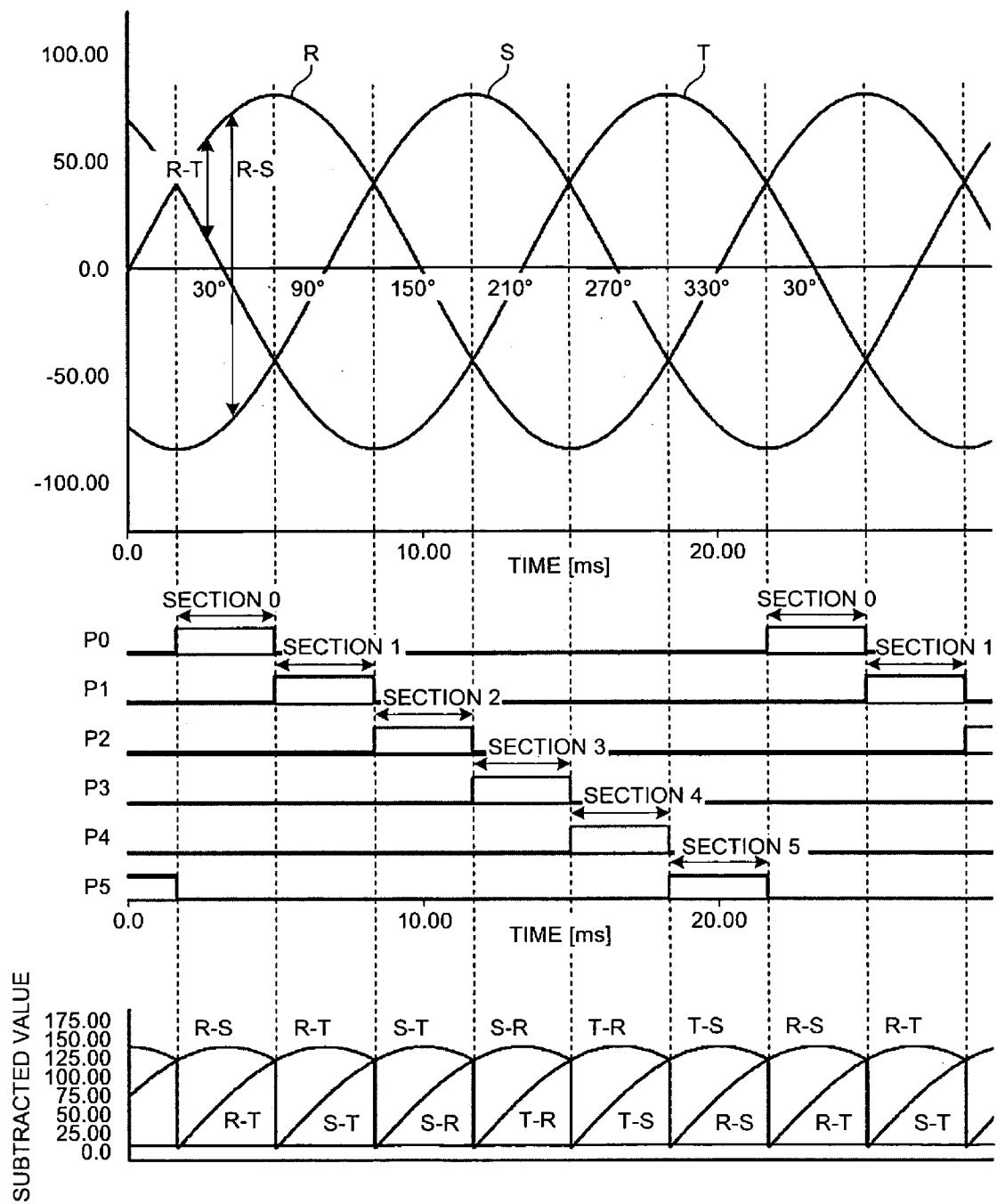
FIG. 1 is a schematic diagram for explaining a concept of a phase detection method according to a first embodiment of the present invention.
Figure 2:
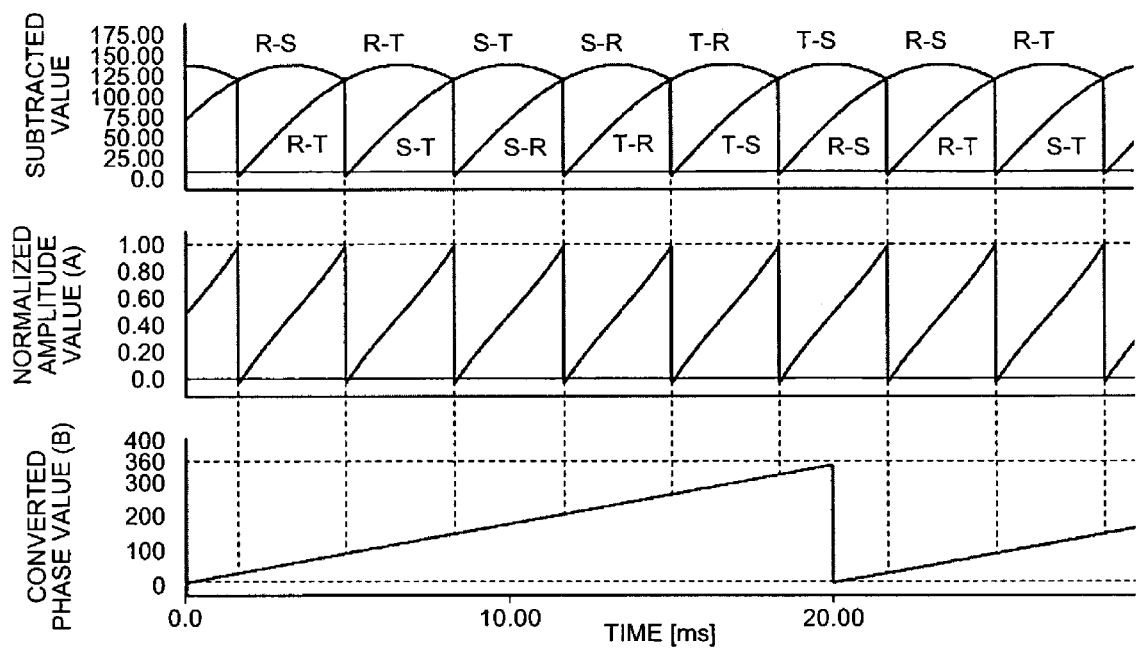
FIG. 2 is a schematic diagram for explaining another concept of the phase detection method according to the first embodiment.

FIGS. 1 and 2 depict a concept of a phase detection method according to a first embodiment of the present invention. An upper part of FIG. 1 depicts three phase signals of R-phase, S-phase, and T-phase. The signals can be voltage signals or current signals. There are six regions in which magnitude correlation of the signals of the respective phases is different. As the phase proceeds, the sequence of R-phase signal>T-phase signal>S-phase signal, R-phase signal>S-phase signal>T-phase signal, S-phase signal>R-phase signal>T- phase signal, S-phase signal>T-phase signal>R-phase signal, T-phase signal>S-phase signal>R-phase signal, and T-phase signal>R-phase signal>S-phase signal is repeated. The variation of the magnitude correlation occurs every time the phase proceeds by 60°, and the magnitude correlation changes at a point where any two of the three phase signals intersect.

When it is assumed that these six regions are respectively sections "0" to "5", the phase of the three-phase signals corresponding to each section is, as shown in the middle part of FIG. 1, 30° to 90° in section "0", 90° to 150° in section "1", 150° to 210° in section "2", 210° to 270° in section "3", 270° to 330° in section "4", 330° to 360° and 0° to 30° in section "5".

When watching respective sections closely, for example, as T-phase in section "0", the value of the intermediate phase has an approximately linear waveform change with respect to the phase change. The phase change can be obtained as an approximate value from the change of the value of the intermediate phase. However, because the value of the intermediate phase changes with an amplitude change of the three phases, the approximate value of the phase cannot be obtained by the value itself of the intermediate phase.

In the first embodiment, as shown in the lower part of FIG. 1, a first subtraction process for subtracting the smallest phase value from the largest phase value in each section, and a second subtraction process for subtracting the intermediate phase value from the largest phase value in sections "0", "2", and "4", and subtracting the smallest phase value from the intermediate phase value in sections "1", "3", and "5" are performed. A result of the second subtraction process has an approximately linear relationship with respect to the phase change, and a result of the first subtraction process has less change with respect to the phase change. For example, as shown in the lower part of FIG. 1, the result of the second subtraction process subtracting the T-phase value from the R-phase value has substantially a linear characteristic with respect to the phase change, and the result of the first subtraction process subtracting the S-phase value from the R-phase value has a flat characteristic having less change with respect to the phase change, in section "0".

Thereafter, a normalization process is performed in which the second subtraction result is divided by the first subtraction result for each section. For example, in section "0", the normalization process is performed by performing the division ((R-phase value)−(T-phase value))/((R-phase value)−(S-phase value)). As a result, as shown in the middle part of FIG. 2, each section has a normalized value, which changes substantially linearly from 0 to 1 with respect to the phase change and does not depend on the amplitude of three phases.

Because the phase width of each section is 60°, the normalized value is multiplied by 60 for each section, and a converted phase value is calculated for each section "0" to "5" by adding the phase 30°, 90°, 150°, 210°, 270°, 330° to the multiplied value, respectively. When the phase value of section "5" is equal to or larger than 360°, a converted phase value is calculated by subtracting the phase 360° from the phase value, thereby calculating a vector phase of one cycle. As a result, as shown in the lower part of FIG. 2, a vector phase that changes substantially linearly at 360° with respect to the phase change can be obtained.

Figure 4:
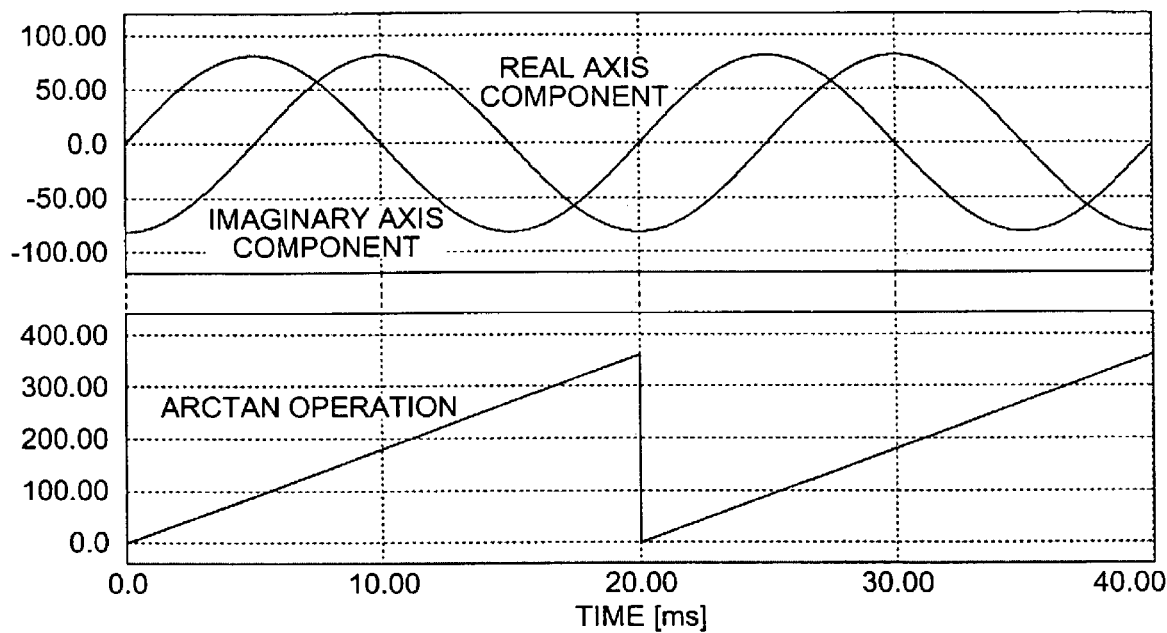
FIG. 4 is a schematic diagram for explaining calculation of a vector phase by performing arctan transform using a real axis component and an imaginary axis component obtained by a three-phase to two-phase conversion.

The specifically obtained converted phase value for every 1° in section "0" (30° to 90°) is as shown in FIGS. 3A and 3B. For example, as shown in FIG. 4, an error between a true phase value obtained by performing an arctan operation and the converted phase value obtained in the first embodiment is as small as approximately less than 1.1°. Likewise in other sections, the accuracy is approximately less than 1.1°.

Accordingly, the vector phase can be easily obtained at high accuracy over the whole sections.

Figure 5:
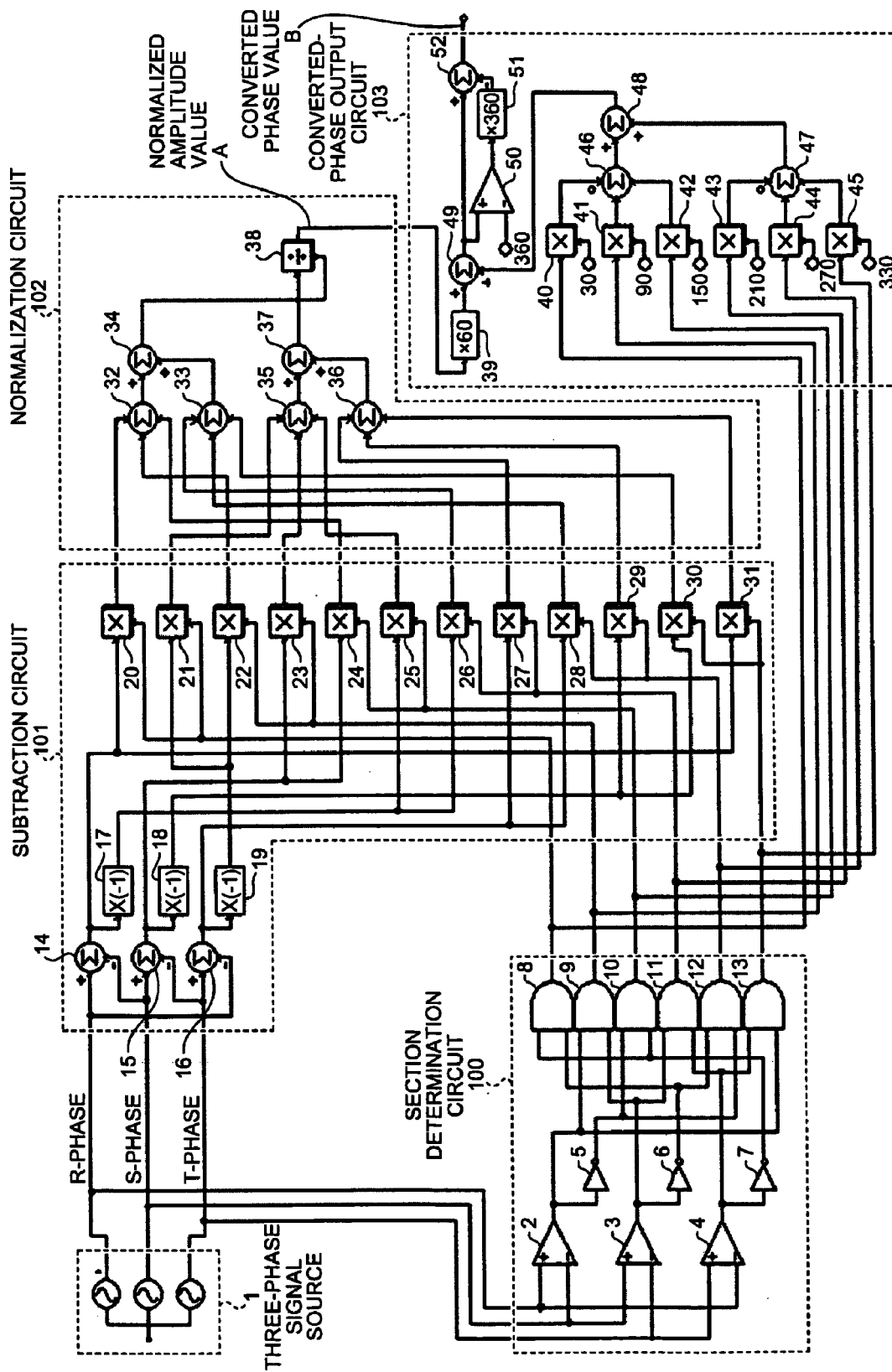
FIG. 5 is a circuit diagram of the configuration of a phase detecting apparatus according to the first embodiment.

A phase detecting apparatus that embodies the phase detection method is explained next. FIG. 5 is a circuit diagram of the configuration of the phase detecting apparatus according to the first embodiment. As shown in FIG. 5, the phase detecting apparatus includes a three-phase signal source 1, a section determination circuit 100, a subtraction circuit 101, a normalization circuit 102, and a converted-phase output circuit 103.

The three-phase signal source 1 outputs three phase signals of R-phase, S-phase, and T-phase. The section determination circuit 100 determines to which of the six sections "0" to "5" the signals belong, based on magnitude correlation of R-phase, S-phase, and T-phase, and outputs the determination result. The section determination circuit 100 includes comparators 2 to 4, and each of the comparators 2 to 4 output "1" when R-phase value>S-phase value, when S-phase value>T-phase value, and when T-phase value>R-phase value. NOT elements 5 to 7 branch-connected to the output of the comparators 2 to 4 output "1", respectively, when R-phase value<S-phase value, when S-phase value<T-phase value, and when T-phase value<R-phase value. The outputs of each of the comparators 2 to 4 and NOT elements 5 to 7 are connected to AND elements 8 to 13. The outputs of the NOT elements 6 and 7 are input to the AND element 8, and the AND element 8 outputs "1" when R-phase value>T-phase value>S-phase value, that is in section "0". The outputs of the comparators 2 and 3 are input to the AND element 9, and the AND element 9 outputs "1" when R-phase value>S-phase value>T-phase value, that is in section "1". The outputs of the NOT elements 5 and 7 are input to the AND element 10, and the AND element 10 outputs "1" when S-phase value>R-phase value>T-phase value, that is in section "2". The outputs of the comparators 3 and 4 are input to the AND element 11, and the AND element 11 outputs "1" when S-phase value>T-phase value>R-phase value, that is in section "3". The outputs of the NOT elements 5 and 6 are input to the AND element 12, and the AND element 12 outputs "1" when T-phase value>S-phase value>R-phase value, that is in section "4". The outputs of the comparators 2 and 4 are input to the AND element 13, and the AND element 13 outputs "1" when T-phase value>R-phase value>S-phase value, that is in section "5".

The subtraction circuit 101 performs the subtraction process explained above with reference to the lower part of FIG. 1 or the upper part of FIG. 2. That is, the subtraction circuit 101 includes subtracters 14 to 16 that perform subtractions ((R-phase value)−(S-phase value)), ((S-phase value)−(T-phase value)), and ((T-phase value)−(R-phase value)), respectively. Polarity inverters 17 to 19 branch-connected to respective subtracters 14 to 16 multiply the outputs of the subtracters 14 to 16 by (−1), respectively, and output ((S-phase value)−(R-phase value)), ((T-phase value)−(S-phase value)), and ((R-phase value)−(T-phase value)). Multipliers 20, 21, 22, 23, 24, 25, 26, 27, 28, 29, 30, and 31 respectively output the first subtraction result and the second subtraction result corresponding to sections "0" to "5" to the normalization circuit 102. Specifically, multipliers 20 to 31 multiply the values of the respective subtracters 14 to 16 and the polarity inverters 17 to 19 by the output from the section determination circuit 100, and output the first subtraction result and the second subtraction result only corresponding to sections "0" to "5", for which "1" is output from the section determination circuit, to the normalization circuit 102. For example, in the case of section "0", ((R-phase value)−(S-phase value)) is output from the multiplier 20, ((R-phase value)−(T-phase value)) is output from the multiplier 21, and nothing is output from other multipliers 22 to 31.

The normalization circuit 102 performs an amplitude normalization process shown in the middle part of FIG. 2. The normalization circuit 102 has adders 32 to 37. The adders 32 to 37 have a function for branch-outputting a denominator and a numerator of division, which is a normalization operation, and adders 32 to 34 output the denominator, and adders 35 to 37 output the numerator. A divider 38 divides the value branch-output on the numerator side by the value branch-output on the denominator side, and outputs a result thereof to the converted-phase output circuit 103 as a normalized amplitude value A. For example, in section "0", ((R-phase value)–(S-phase value)) output from the multiplier 20 is input to the denominator side of the divider 38 via the adders 32 and 34, and ((R-phase value)–(T-phase value)) output from the multiplier 21 is input to the numerator side of the divider 38 via the adders 35 and 37, thereby performing an amplitude normalization operation of section "0".

The converted-phase output circuit 103 outputs the converted phase value shown in the lower part of FIG. 2. A multiplier 39 multiplies the normalized value output from the normalization circuit 102 by 60 and outputs the result thereof to an adder 49. On the other hand, outputs of the AND elements 8 to 13 in the section determination circuit 100 are respectively input to multipliers 40 to 45. When "1" is output from respective AND elements 8 to 13, values of 30, 90, 150, 210, 270, and 330 are output to the adder 49 via the adders 46 to 48. The adder 49 adds the value output from the multiplier 39 and the value output from any one of the multipliers 40 to 45, and outputs the result thereof as a converted phase value B, which is the vector phase. A comparator 50 branch-connected to the adder 49 compares the output of the adder 49 with 360 to determine whether the output of the adder 49 is above 360. When the output of the adder 49 is above 360, the comparator 50 outputs "1" to a multiplier 51, and the multiplier 51 multiplies "1" by 360, and outputs (−360) to an adder 52 to be added. A value obtained by subtracting 360 from the value output from the adder 49 is output as the converted phase value B. That is, the converted phase value B in section "5" is output.

In the first embodiment, the vector phase can be obtained on the real time basis with a simple configuration, with accuracy as high as an error from the true vector phase value being within approximately 1.1°.

Figure 6:
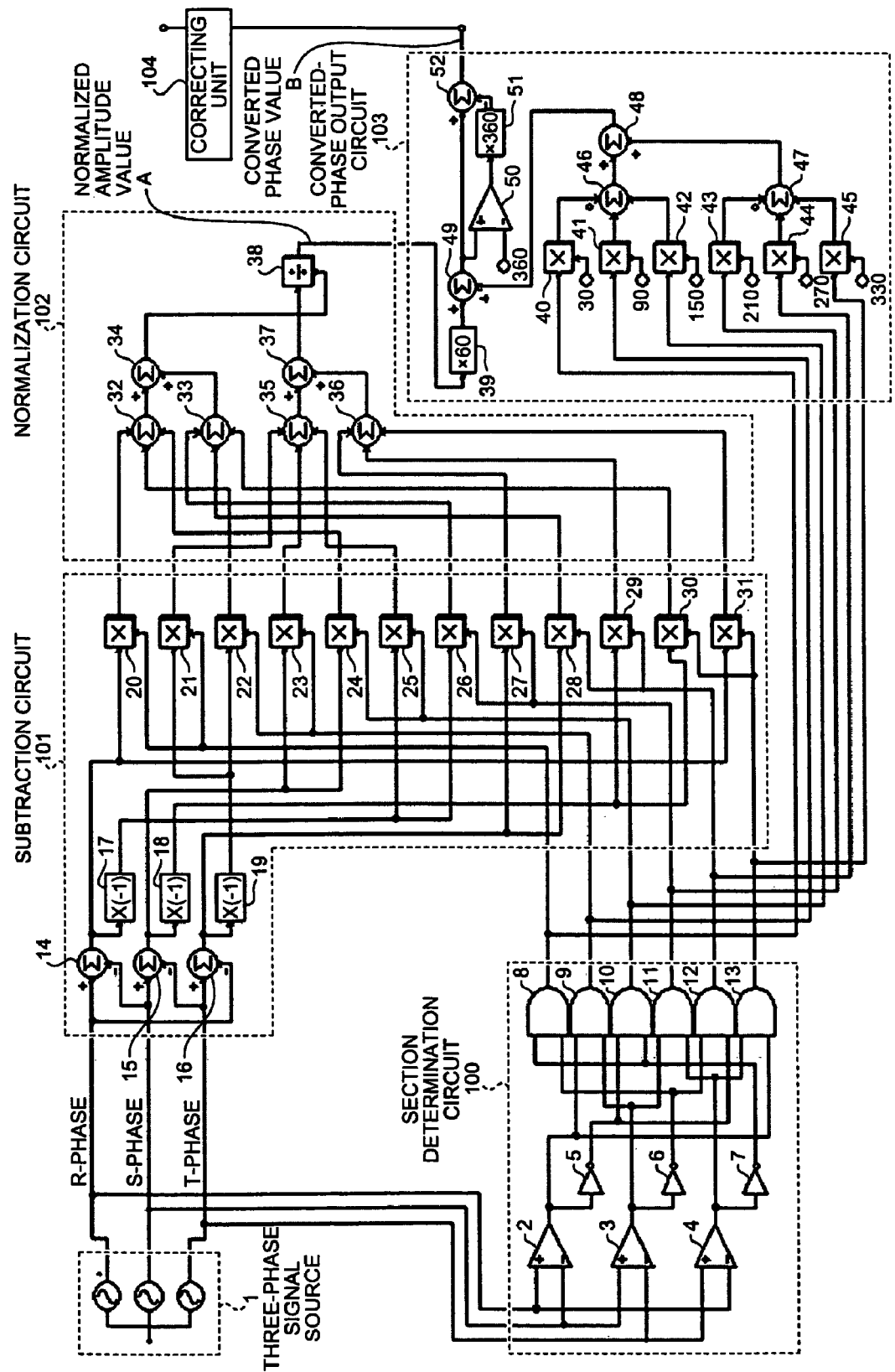
FIG. 6 is a circuit diagram of the configuration of a modification of the phase detecting apparatus according to the first embodiment.

As shown in FIG. 6, a correcting unit 104 that performs phase correction with respect to the converted phase value B can be added to the configuration shown in FIG. 5. Specifically, a correction table in which a relationship between the converted phase value and the error shown in FIGS. 3A and 3B is stored is provided for all sections, and the correcting unit 104 performs addition and subtraction to eliminate the error. Consequently, a linear characteristic of the phase can be ensured in each section, thereby enabling highly accurate detection of the vector phase. Further, when the correction table is used, in the case of a value between values stored in the correction table, interpolation can be performed.

In the second subtraction, the intermediate phase value is subtracted from the largest phase value in sections "0", "2", and "4", and the smallest phase value is subtracted from the intermediate phase value in sections "1", "3", and "5". However, subtraction in sections "0", "2", and "4" and subtraction in sections "1", "3", and "5" can be reversed. That is, the smallest phase value is subtracted from the intermediate phase value in sections "0", "2", and "4", and the intermediate phase value is subtracted from the largest phase value in sections "1", "3", and "5". In this case, the converted phase value can be output, for example, by subtracting the second calculation result from 1.

An explanation has been given about with three phase signals, however, the number of phase signals is not limited to three. In other words, a plurality of phase signals can be employed. In this case, division of sections can be performed at a position where two phase signals intersect with each other, and subtraction capable of obtaining the linear characteristic and subtraction capable of obtaining the substantially flat characteristic in each section can be performed to obtain the normalized value.

A second embodiment of the present invention is explained next. In the first embodiment, the phase detecting apparatus is constructed by hardware. In the second embodiment, however, the phase detection method described in the first embodiment is realized by software. The software is stored as a computer program in a read only memory (ROM) or random access memory (RAM), read and executed by a central processing unit (CPU), and realized by a microcomputer or the like.

Figure 7:
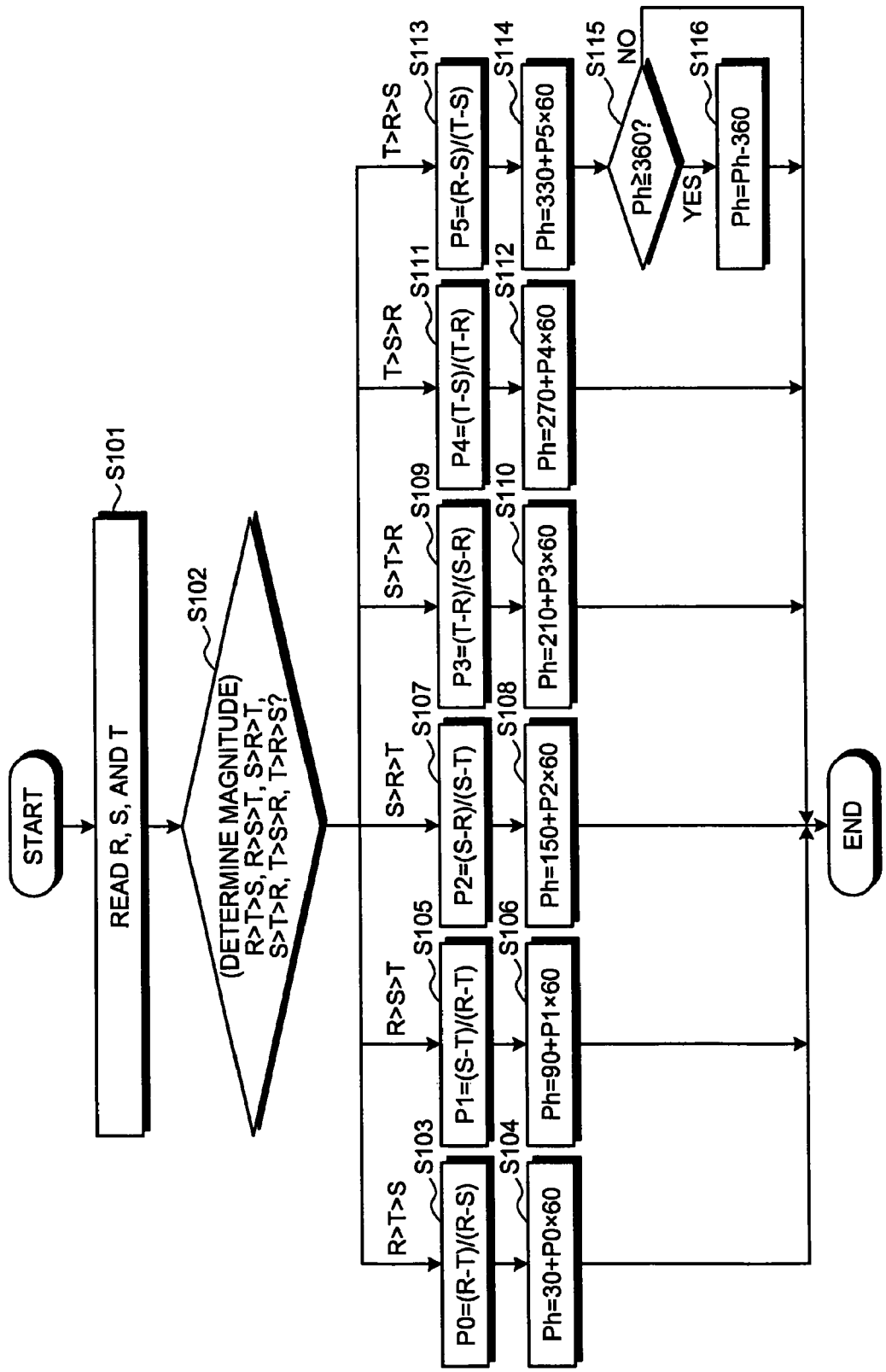
FIG. 7 is a flowchart of a phase detection method according to a second embodiment of the present invention.

FIG. 7 is a flowchart of the phase detection method according to the second embodiment. To begin with, values of R-phase, S-phase, and T-phase of three-phase signal source 1 are read (step S101), and six magnitude correlations are determined based on the read three values (step S102).

In the case of magnitude correlation (section "0") of R-phase value>T-phase value>S-phase value, a normalized amplitude value P0=(R−T)/(R−1) is obtained (step S103), a converted phase value Ph=30+P0×60 is obtained (step S104), and the obtained converted phase value Ph is output as the vector phase.

In the case of magnitude correlation (section "1") of R-phase value>S-phase value>T-phase value, a normalized amplitude value P1=(S−T)/(R−T) is obtained (step S105), a converted phase value Ph=90+P1×60 is obtained (step S106), and the obtained converted phase value Ph is output as the vector phase.

In the case of the magnitude correlation (section "2") of S-phase value>R-phase value>T-phase value, a normalized amplitude value P2=(S−R)/(S−T) is obtained (step S107), a converted phase value Ph=150+P2×60 is obtained (step S108), and the obtained converted phase value Ph is output as the vector phase.

In the case of magnitude correlation (section "3") of S-phase value>T-phase value>R-phase value, a normalized amplitude value P3=(T−R)/(S−R) is obtained (step S109), a converted phase value Ph=210+P3×60 is obtained (step S110), and the obtained converted phase value Ph is output as the vector phase.

In the case of magnitude correlation (section "4") of T-phase value>S-phase value>R-phase value, a normalized amplitude value P4=(T−S)/(T−R) is obtained (step S111), a converted phase value Ph=270+P4×60 is obtained (step S112), and the obtained converted phase value Ph is output as the vector phase.

In the case of magnitude correlation (section "5") of T-phase value>R-phase value>S-phase value, a normalized amplitude value P5=(R−S)/(T−S) is obtained (step S113), a converted phase value Ph=330+P5×60 is obtained (step S114). It is determined whether the obtained converted phase value Ph is equal to or larger than 360 (step S115). When the obtained converted phase value Ph is equal to or larger than 360, 360 is subtracted from the converted phase value Ph (step S116) to output the subtracted converted phase value Ph as the vector phase. When the obtained converted phase value Ph is less than 360, the converted phase value Ph is output as the vector phase.

Figure 8:
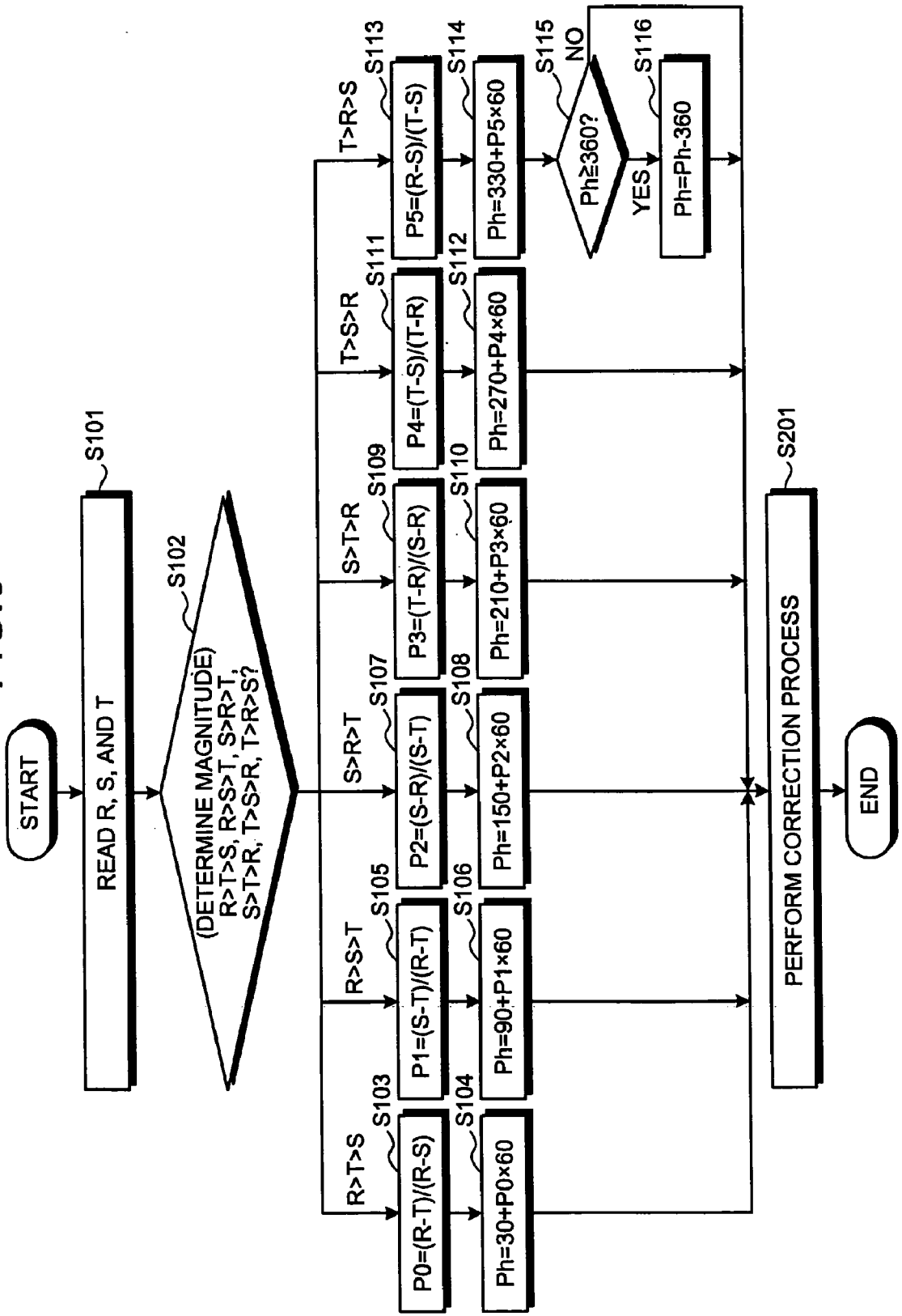
FIG. 8 is a flowchart of a phase detection method according to a modification of the second embodiment.

As shown in FIG. 8, a correction process for correcting an error of the converted phase value Ph obtained by the process procedure shown in FIG. 7 can be performed (step S201), to output the corrected value as the vector phase. The correction process is performed using the correction table as in the correcting unit 104 shown in FIG. 6. Accordingly, highly accurately phase detection can be performed on the real time basis with a simple configuration.

A third embodiment of the present invention is explained next. The third embodiment realizes a synchronous motor controller using the phase detecting apparatus or the phase detection method described in the first and second embodiments.

Figure 9:
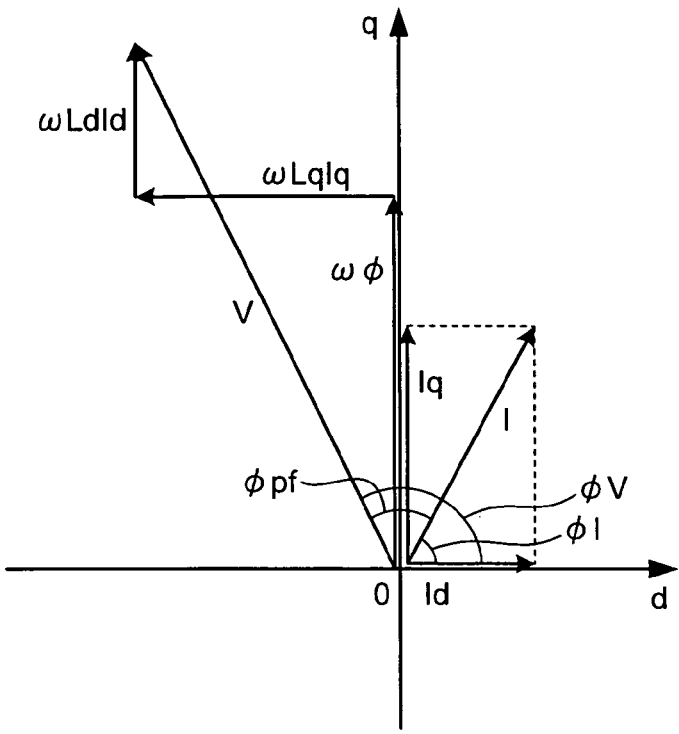
FIG. 9 depicts a relationship between voltage and current on a rotational coordinate system.

The synchronous motor during a synchronous operation, for example, a permanent-magnet (PM) motor is explained. FIG. 9 is a vector diagram of induced voltage, current, and voltage in a rotational coordinate system of the PM motor during a synchronous operation. Ld denotes d-axis reactance, Lq denotes q-axis reactance, Φ denotes an induced voltage constant of the motor, I denotes current, and V denotes voltage. φI denotes current phase, φV denotes voltage phase, φpf denotes a phase difference between current and voltage and expresses a power factor. Applied torque is denoted as T.

With reference to FIG. 9, because φI=arctan (Iq/Id), and φV=arctan((Φ+LdId)/LqIq), following relations exist:

$$\phi pf = \phi V - \phi I = \arctan((\Phi + LdId)/LqIq) - \arctan(Iq/Id) \quad (1)$$

$$V = \omega((\Phi + LdId)/LqIq)^2 + (LqIq)^2)^{1/2} \quad (2)$$

$$T = \Phi Iq + (Ld - Lq)IdIq \text{ (where } T \text{ is torque)} \quad (3).$$

If Equations (1) to (3) are established continuously and simultaneously during an operation, synchronization also continues. During the operation, torque T is determined according to a load, however, it is constant in a short period of time. An angular frequency ω is also constant in a short period of time. If it is assumed here that the power factor φpf is constant, Id and Iq are uniquely determined according to Equations (1) and (3), and magnitude of voltage V is uniquely determined. Accordingly, if voltage V can be controlled so that Equation (2) is established with respect to the power factor φpf, Equations (1) and (3) can be established during the operation, and synchronization of the operation continues.

The vector diagram shown in FIG. 9 is a rotational coordinate system. However, because the power factor φpf is a relative phase difference between voltage and current, it does need not to be a phase difference of the rotational coordinate system, and can be detected similarly by a fixed coordinate system. The magnitude of voltage V can be also detected by the fixed coordinate system, because it is invariable in the rotational coordinate system and the fixed coordinate system.

Therefore, synchronization of the operation is enabled by controlling the amplitude of voltage based on the power factor detected by the fixed coordinate system. That is, a sensorless synchronous operation is enabled without requiring position detection.

Figure 10:
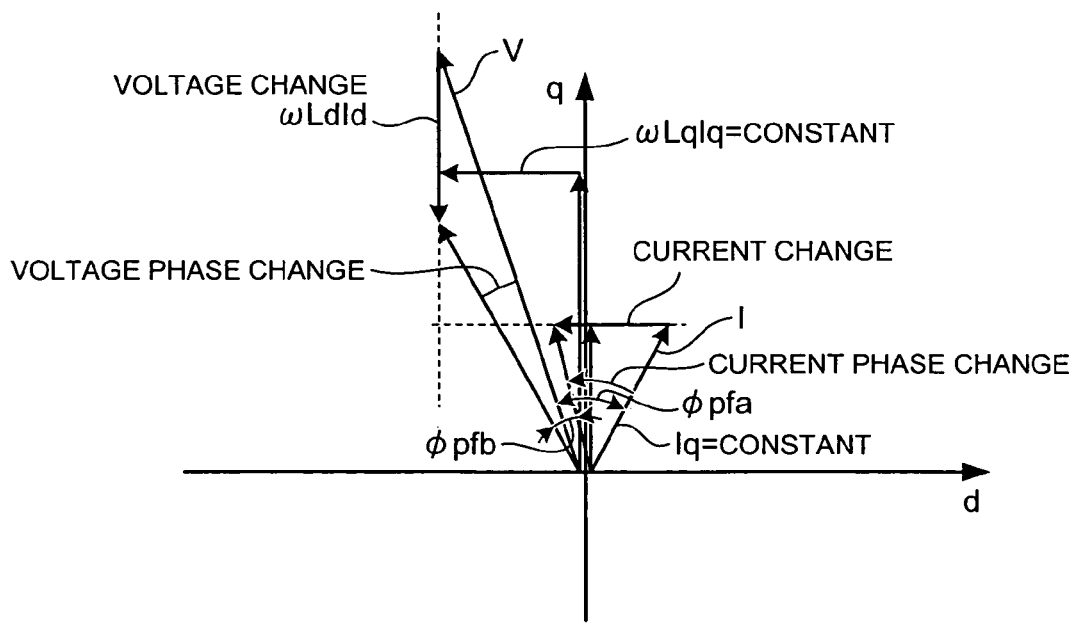
FIG. 10 depicts a relationship among voltage fluctuation, current fluctuation, and phase difference fluctuation on the rotational coordinate system.

The control method of the synchronous motor according to the phase difference of the voltage amplitude is explained here. FIG. 10 is a schematic diagram for explaining a relationship between voltage change and phase difference change between current and voltage in a simplified manner. In FIG. 10, when torque T is constant, Iq is considered to be substantially constant, and a terminal point of a vector of current I moves parallel with axis d. On the other hand, a terminal point of a vector of voltage V moves vertical to axis q. The direction is such that as the terminal point of the vector of current I moves from right to left in the drawing, the terminal point of the vector of voltage V moves from above downward in the drawing. At this time, the amplitude of voltage V decreases.

On the other hand, when a vector phase change of voltage V is compared with a vector phase change of current I, a phase change in current I is larger than that in voltage V, and as shown in FIG. 10, the phase difference decreases, changing from phase difference φpfa to phase difference φpfb. That is, a relationship between the amplitude of voltage V and the phase difference φpf is such that when the amplitude of voltage V is increased, the phase difference φpf also increases, and when the amplitude of voltage V is decreased, the phase difference φpf also decreases. Therefore, if the amplitude of voltage V with respect to the phase difference φpf is controlled by the relationship between the amplitude of voltage V and the phase difference φpf, Equations (1) to (3) can be satisfied.

As a result, when the phase difference φpf is to be increased, the amplitude of voltage V is increased, and when the phase difference φpf is to be decreased, the amplitude of voltage V is decreased, thereby satisfying Equations (1) to (3) and enabling synchronous control of the synchronous motor (first control method).

When the load abruptly changes or when speed control is being performed, time is required until Equations (1) to (3) are established only by the amplitude control of voltage V, thereby causing an unstable state. Therefore, the phase difference φpf until Equations (1) to (3) are established needs to be stabilized, and therefore it is desired to directly control the voltage phase so that a change of the phase difference φpf is hindered, by feeding back the change of the phase difference φpf (second control method).

Further, the relationship between the amplitude of voltage V and the phase difference φpf for establishing Equations (1) to (3) depends on the torque and angular velocity. Therefore, it is preferable to change a gain of a regulator according to the torque and the angular velocity as the optimum regulated gain (third control method).

By the first to the third control methods, sensorless synchronous control of the synchronous motor can be stably performed with high accuracy at the time of startup, at the time of load fluctuation, and at the time of velocity control.

Figure 11:
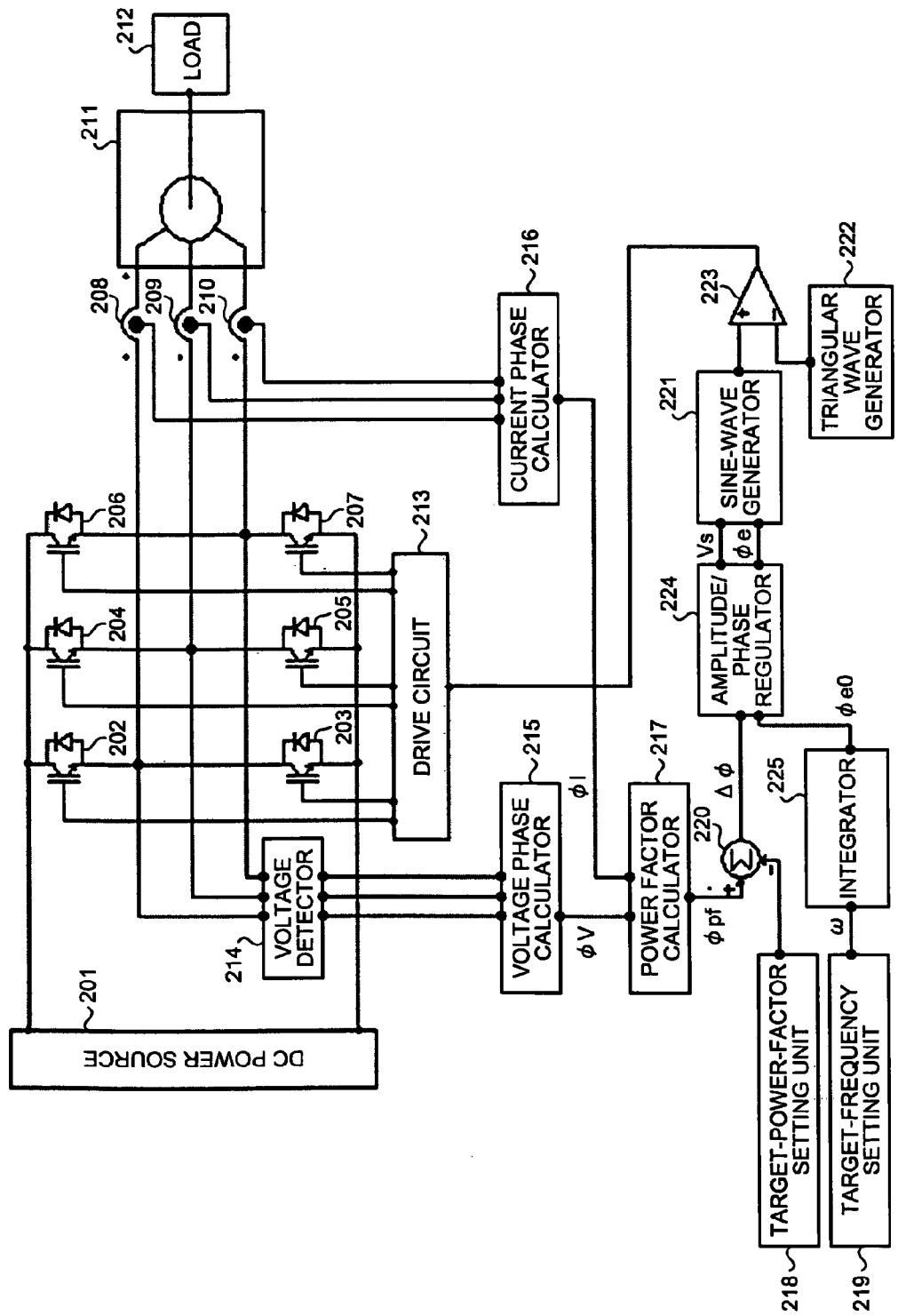
FIG. 11 is a block diagram of a synchronous motor controller according to a third embodiment of the present invention.

FIG. 11 is a block diagram of the configuration of a synchronous motor controller according to the third embodiment. The synchronous motor controller is a so-called inverter. Switching elements 202 to 207 constitute a bridge circuit, and the respective switching elements 202 to 207 are driven and controlled by a drive circuit 213 to convert an DC input from a DC power source 201 to a three-phase AC signal, and the three-phase AC signal is supplied as an AC power supply of a synchronous motor 211. The synchronous motor 211 drives a load 212.

A voltage detector 214 detects a three-phase voltage amplitude value from an input port to the synchronous motor 211 of the three-phase AC signal output from the bridge circuit. A voltage phase calculator 215 calculates voltage phase φV, which is the vector phase of the voltage, based on the three-phase voltage amplitude value. On the other hand, current detectors 208 to 210 are provided at the input port of the synchronous motor 211 to detect a three-phase current amplitude value. A current phase calculator 216 calculates current phase φI, which is the vector phase of the current, based on the three-phase current amplitude value detected by the current detectors 208 to 210. The voltage phase calculator 215 and the current phase calculator 216 are realized by the phase detecting apparatus or a device using the phase detection method described in the first and second embodiments. The voltage phase calculator 215 and the current phase calculator 216 can be realized by the circuit described in the first embodiment or can be realized by the software described in the second embodiment. In any case, the voltage phase calculator 215 and the current phase calculator 216 can detect the voltage phase φV and the current phase φI highly accurately on the real time basis with a simple configuration.

While the voltage phase φV and the current phase φI shown in FIGS. 9 and 10 are the phase in the rotational coordinate system, the voltage phase φV and the current phase φI respectively calculated by the voltage phase calculator 215 and the current phase calculator 216 are the phase for calculating a phase difference φpf, which need not be the phase on the rotational coordinate, and are the phase calculation result on the fixed coordinate.

A power factor calculator 217 calculates the power factor φpf, which is a phase difference between the voltage phase φV and the current phase φI respectively output from the voltage phase calculator 215 and the current phase calculator 216, to output the power factor φpf to a subtracter 220. On the other hand, a target-power-factor setting unit 218 outputs a set target value of the power factor to the subtracter 220. The subtracter 220 outputs a power factor deviation Δφ obtained by subtracting the target value of the power factor from the power factor φpf output from the power factor calculator 217 to an amplitude/phase regulator 224.

On the other hand, a target-frequency setting unit 219 outputs a target angular frequency ω to an integrator 225, and the integrator 225 integrates the target angular frequency ω to convert it to a reference phase φe0, and outputs the reference phase φe0 to the amplitude/phase regulator 224.

The amplitude/phase regulator applies the first to the third control methods, and has a control unit that outputs voltage amplitude Vs for increasing the amplitude of the voltage V when the phase difference Δφ increases narrowly, for example, an amplitude regulating function for changing the amplitude gain by a variable-gain I regulator or PI regulator, and a control unit that outputs a phase amount φe for retarding the reference phase φe0 of the voltage V when the phase difference Δφ increases greatly, for example, a phase regulating function for fine-tuning the reference phase φe0 based on the output of the variable-gain I regulator or PI regulator.

A sine-wave generator 221 generates a sine wave having the voltage amplitude Vs and the phase amount φe output from the amplitude/phase regulator 224 to output the sine wave to a positive terminal of a comparator 223. A triangular wave from a triangular wave generator 222 is input to a negative terminal of the comparator 223. The comparator 223 outputs a pulse-width modulation (PWM) control signal modulated by the triangular wave to the drive circuit 213, and the drive circuit 213 drives and controls the respective switching elements 202 to 207 to output the three-phase AC signal.

In the third embodiment, the voltage V is regulated to satisfy Equations (1) to (3) and synchronously operated by the amplitude regulating function of the amplitude/phase regulator 224. Excessive stability is held by directly controlling the phase by the phase regulating function, thereby enabling the operation at the time of velocity fluctuation, at the time of load fluctuation, and at the time of startup. It is because the voltage phase calculator 215 and the current phase calculator 216 can detect the phase on the real time basis that such a highly accurate synchronous operation is possible. Further, highly accurate synchronous operation control of the synchronous motor can be performed with a simple configuration, without requiring any complicated process such as position estimation of the rotor of the synchronous motor.

Further, according to the control method and the controller, dependence on the motor constant (winding reactance (Ld, Lq), induced voltage constant, winding resistance, moment of inertia, and the like) is little. Accordingly, time required for adaptability verification of the control (matching of control characteristic) with respect to the motor constant, which has been conventionally required for each type of the motor to be used, can be reduced, thereby enabling reduction of operation cost and simplification of change to another type of motor.

Figure 12:
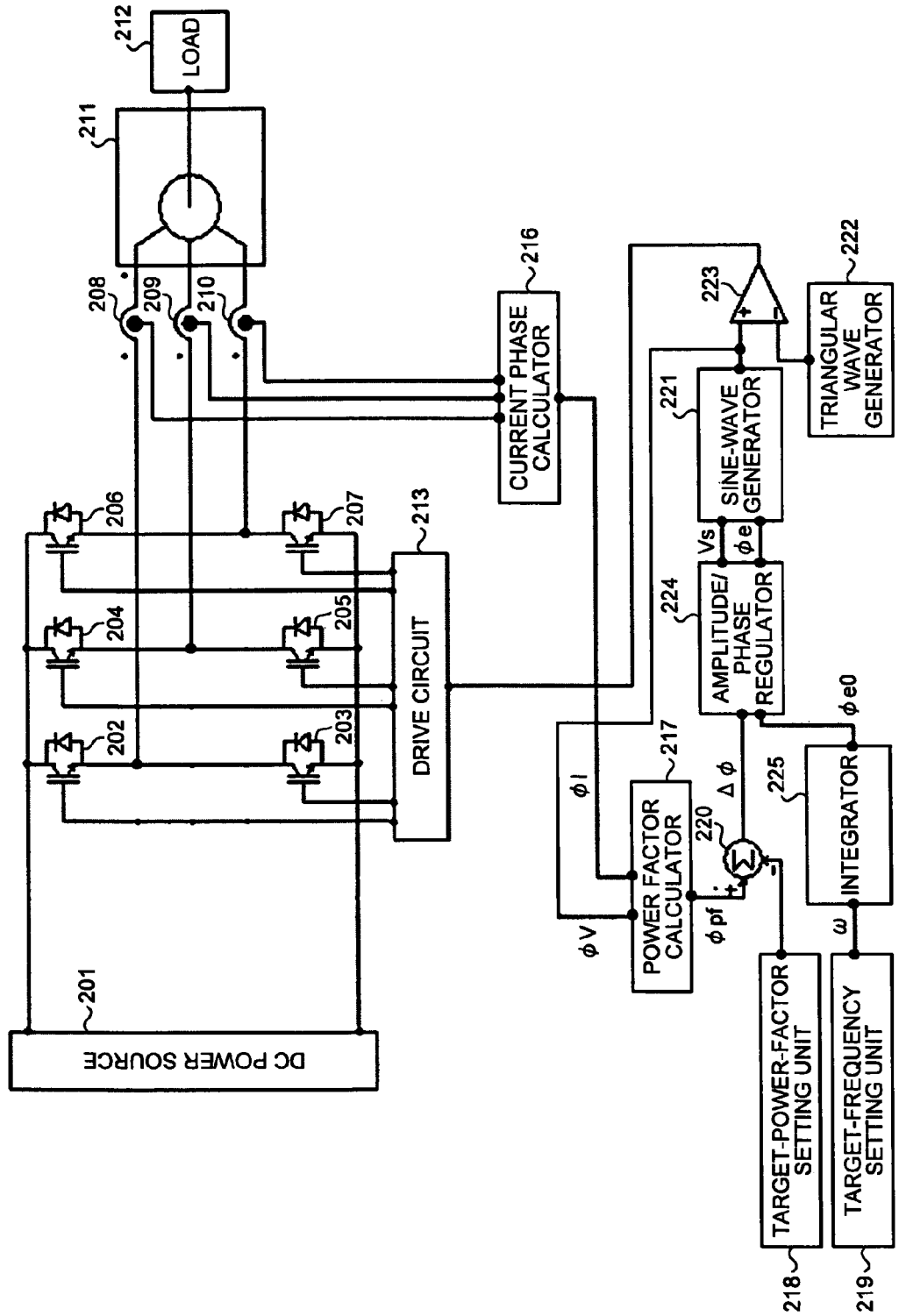
FIG. 12 is a block diagram of a first modification of the synchronous motor controller according to the third embodiment.

The voltage phase calculator 215 detects the actual three-phase voltage by providing the voltage detector 214. However, because the three-phase voltage is determined based on the output from the bridge circuit, as shown in FIG. 12, the output phase of the sine-wave generator 221 can be directly used. In this case, the configuration of the voltage detector 214 and the voltage phase calculator 215 is eliminated, thereby enabling a simpler configuration.

Figure 13:
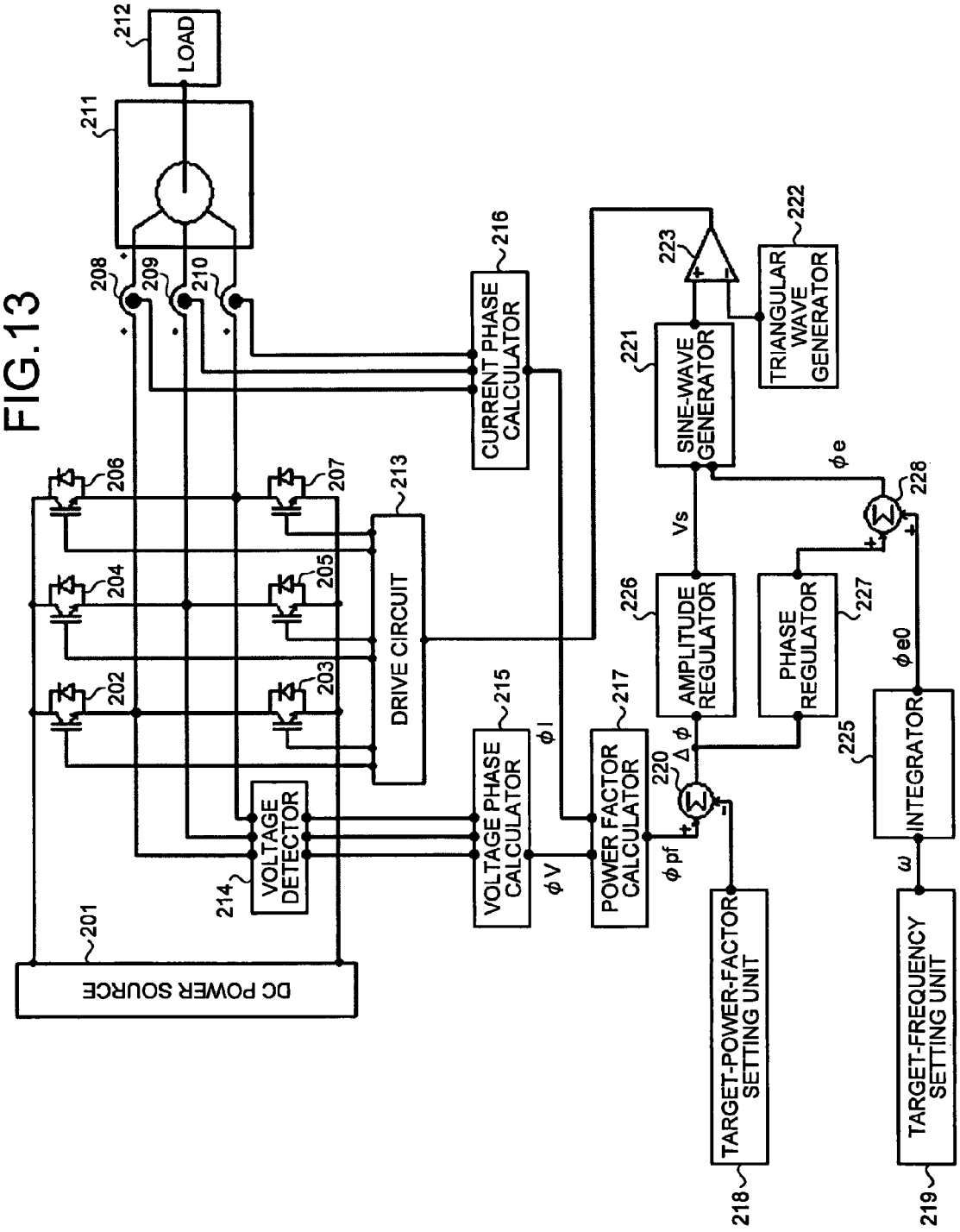
FIG. 13 is a block diagram of a second modification of the synchronous motor controller according to the third embodiment.

As shown in FIG. 13, the amplitude/phase regulator 224 shown in FIG. 11 can be separated into an amplitude regulator 226 and a phase regulator 227. The amplitude regulator 226 outputs the voltage amplitude Vs regulated so that the power factor deviation Δφ decreases to the sine-wave generator 221. The phase regulator 227 outputs a phase regulated amount regulated so that the power factor deviation Δφ decreases to an adder 228, and the adder 228 outputs a phase amount φe obtained by adding the phase regulated amount to the reference phase φe0 to the sine-wave generator 221.

Figure 14:
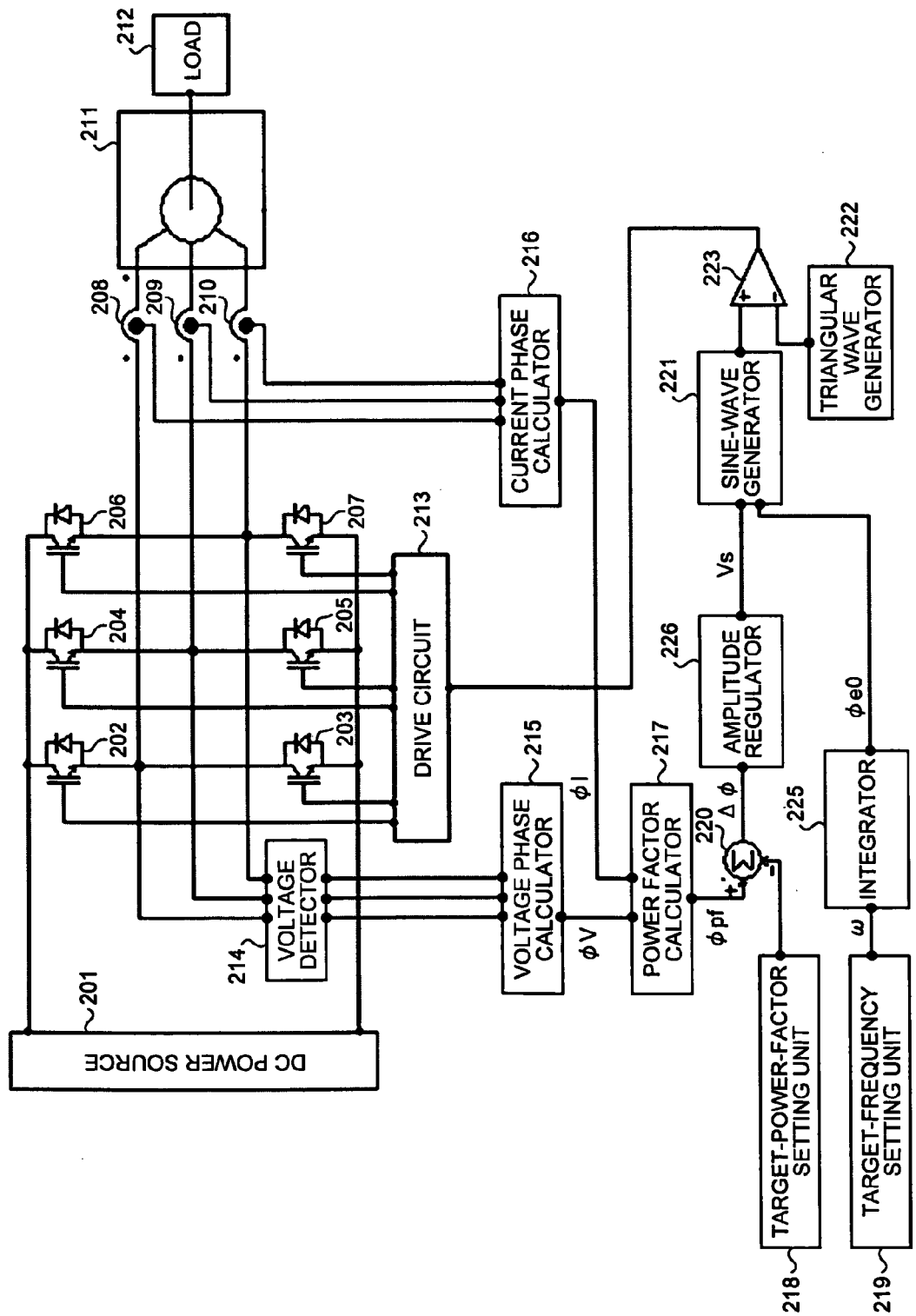
FIG. 14 is a block diagram of a third modification of the synchronous motor controller according to the third embodiment.

Further, as shown in FIG. 14, the first control method can be applied to regulate only the amplitude of the voltage V so that the power factor deviation Δφ decreases. In this case, the phase regulator 227 and the adder 228 shown in FIG. 13 are not provided, thereby further simplifying the configuration. The reference phase φe0 from the integrator 225 is directly output to the sine-wave generator 221. The synchronous motor controller shown in FIG. 14 is preferable for control of the synchronous motor having less velocity fluctuation and load fluctuation.

A fourth embodiment of the present invention is explained next. In the fourth embodiment, a synchronous operation can be performed with an optimum power factor capable of increasing the power consumption efficiency.

The driven state of the synchronous motor is uniquely determined according to the power factor and the torque. Therefore, a table describing a relationship between the driven state and an optimum power factor having high power consumption efficiency corresponding to the torque is formed to set an optimum power factor, thereby enabling a synchronous operation matched with a driving purpose.

Figure 15:
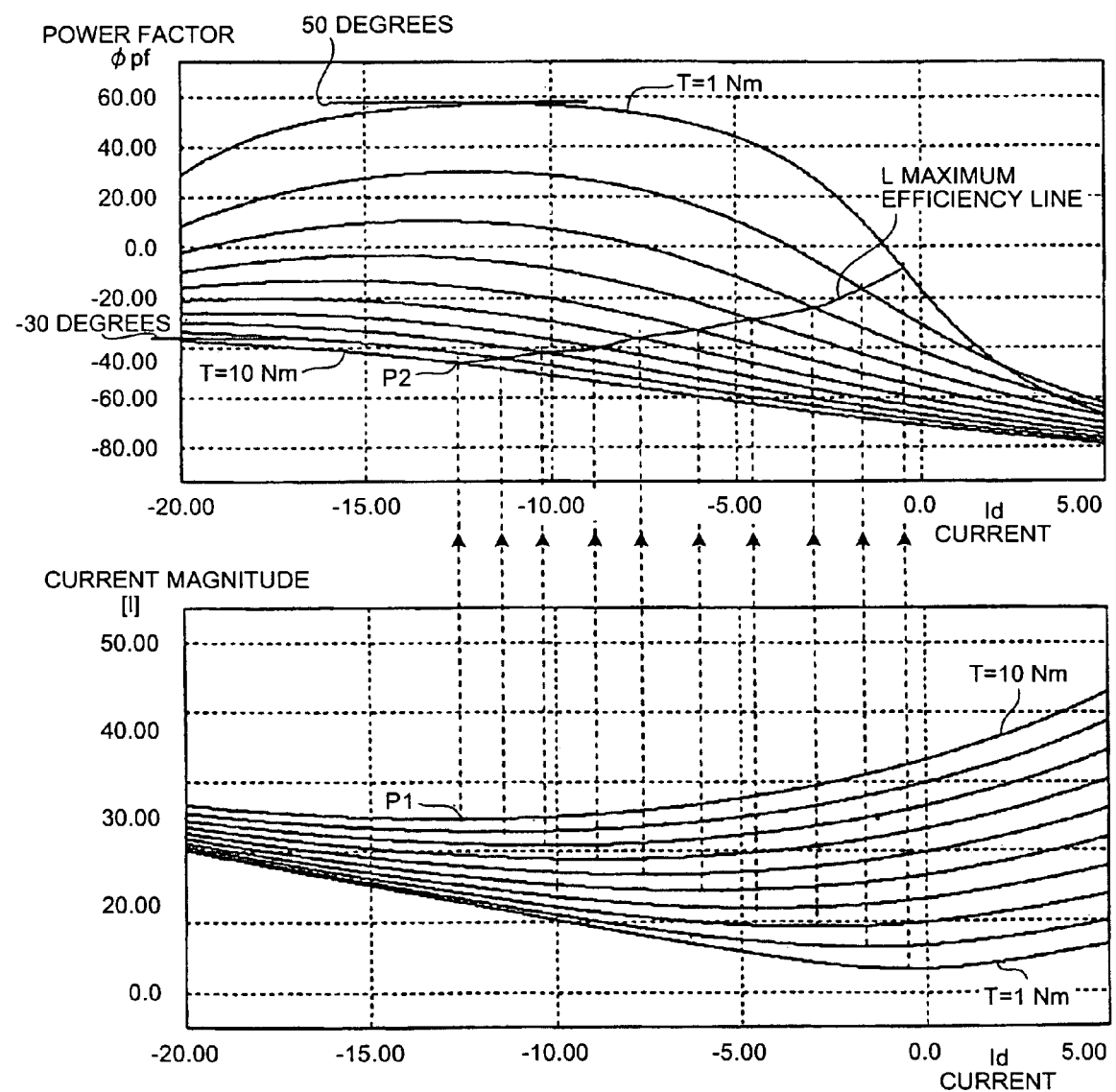
FIG. 15 depicts a relationship between a torque and a power factor, at which power consumption efficiency becomes the largest.

FIG. 15 depicts an optimum power factor characteristic having high power consumption efficiency when the torque is set as a parameter. The upper part of FIG. 15 depicts a change of power factor with respect to a change of current Id, using the torque as the parameter, and the lower part of FIG. 15 depicts a change of current magnitude with respect to a change of current Id, using the torque as the parameter. From the upper part of FIG. 15, it is seen that the range of the power factor φpf that can be taken is limited by the size of the torque. For example, with a torque of 1 Newton-meter (Nm), operations can be performed even if the power factor φpf is set to a level of approximately less than 50 degrees; however, when the torque is 10 Nm, operations cannot be performed unless the power factor φpf is set to a level of approximately less than −30 degrees. That is, the power factor needs to be set, matched with the torque value.

The current magnitude in the lower part of FIG. 15 corresponds to a resistance loss. Therefore, the resistance loss becomes the smallest and the power consumption efficiency becomes the largest, at a point where the current magnitude is the smallest. When a plurality of points P1 at which the power consumption efficiency becomes the largest is plotted as points P2 on the torque line corresponding to the upper part of FIG. 15, a maximum efficiency line L is obtained. That is, a relationship of the power factor with respect to the torque where the power consumption efficiency becomes the largest is obtained.

Figure 16:
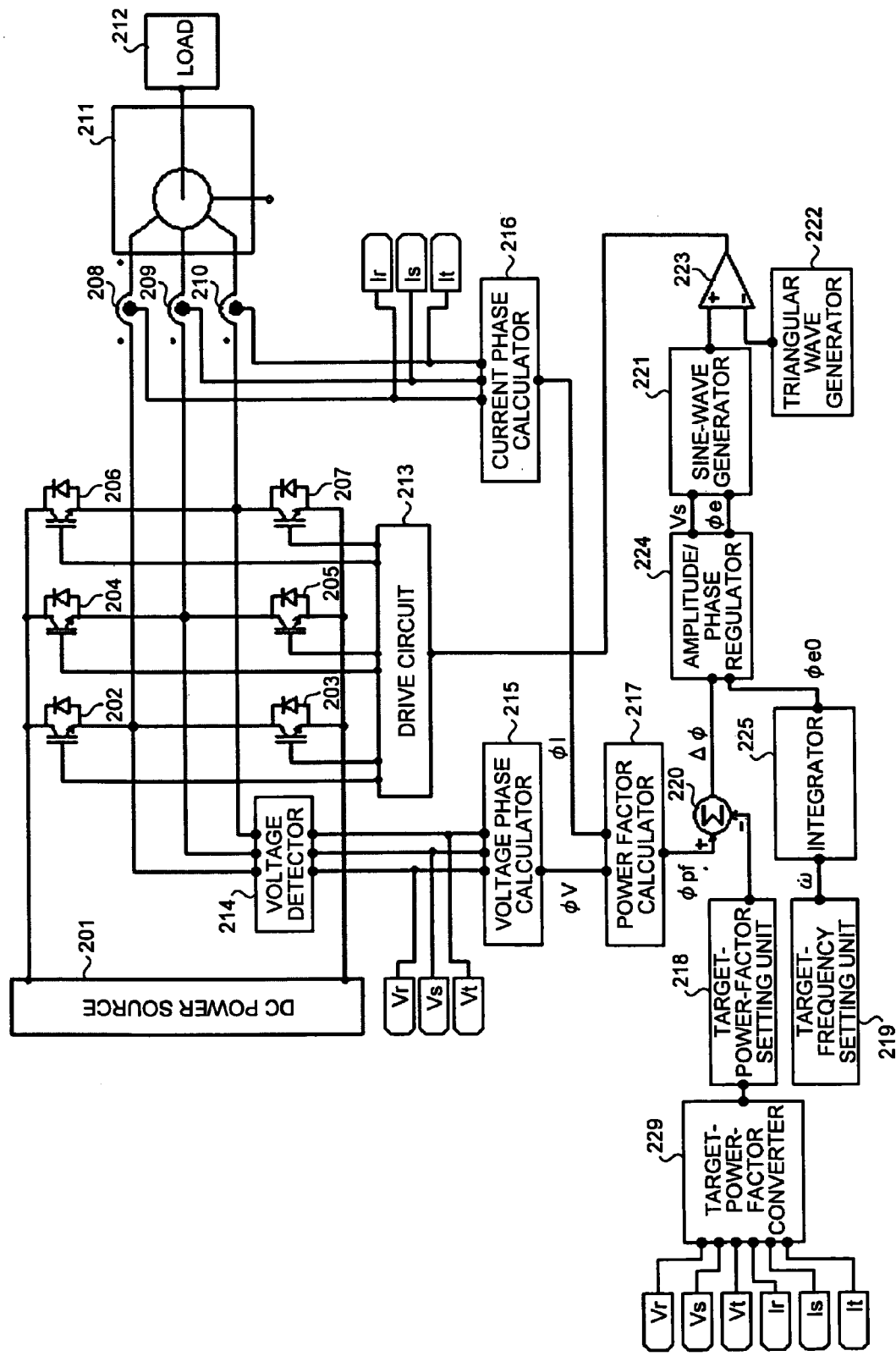
FIG. 16 is a block diagram of a synchronous motor controller according to a fourth embodiment of the present invention.

As shown in FIG. 16, therefore, a target-power-factor converter 229 is added to the configuration shown in FIG. 11. The target-power-factor converter 229 uses the table in which the relationship of the power factor with respect to the torque where the power consumption efficiency becomes the largest is stored, to output the power factor, at which the power consumption efficiency becomes the largest with respect to the input torque, to the target-power-factor setting unit 218. The input torque can be calculated by monitoring voltages Vr, Vs, and Vt of the R-phase, S-phase, and T-phase detected by the voltage detector 214, and monitoring currents Ir, Is, and It of the R-phase, S-phase, and T-phase detected by the current detectors 208 to 210.

In the fourth embodiment, the voltage and the current of respective phases are detected, to calculate the torque from the detected values, and the target value of the power factor is set, at which the power consumption efficiency becomes the largest with respect to the calculated torque. Accordingly, synchronous operations can be performed with excellent power consumption efficiency.

As described above, in the fourth embodiment, the target value of the power factor is set, at which the power consumption efficiency becomes the largest with respect to the torque. However, because the torque is inversely proportional to the angular frequency ω of the synchronous motor, the angular frequency ω can be detected to set the target value of the power factor, at which the power consumption efficiency becomes the largest with respect to the torque, also taking the detected angular frequency into consideration.

With the phase detection method and the phase detecting apparatus according to an aspect of the present invention, it is determined which of a plurality of continuous sections having different magnitude correlation of signal amplitude of each phase the section is based on an input signal amplitude value of a plurality of phases, predetermined subtraction is performed with respect to the signal amplitude between respective phases for each determined section, to obtain a normalized amplitude value normalized in the section, using the subtraction result, and the normalized amplitude value is converted to a vector phase for one cycle based on a predetermined phase, and the vector phase is output corresponding to the section determined at the section determination step. Accordingly, phase detection can be performed easily and highly accurately on the real time basis, without performing complicated calculation having a large load, such as an arctan operation.

Moreover, a voltage vector phase and a current vector phase to be applied to the synchronous motor are obtained based on the phase detection method or the phase detecting apparatus described above, to calculate a power factor, which is a phase difference between the voltage vector phase and the current vector phase on the real time basis. Accordingly, synchronous operations of the synchronous motor can be controlled with a simple configuration and with high accuracy.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A phase detection method comprising:
determining which of a plurality of continuous sections having different magnitude correlation of signal amplitude of each phase a section is, based on an input signal amplitude value of a plurality of phases;
normalizing including performing predetermined subtraction with respect to the signal amplitude between respective phases for each section determined at the determining, to obtain a normalized amplitude value normalized in the section, using the subtraction result; and
outputting including converting the normalized amplitude value obtained at the normalizing to a vector phase for one cycle based on a predetermined phase, and outputting the vector phase corresponding to the section determined at the determining.

2. The phase detection method according to claim 1, wherein at the outputting, when a starting point and an end point of the vector phase is included in the section, the vector phase value after the end point is converted to a vector phase value after the starting point.

3. The phase detection method according to claim 1, wherein at the normalizing, a value obtained by dividing a value as a result of a second subtraction, at which the subtraction result between signal amplitudes of respective phases in the section has a linear characteristic, by a value as a first subtraction result, at which the subtraction result between signal amplitudes of respective phases in the section has approximately a flat characteristic, is output as a normalized amplitude value.

4. The phase detection method according to claim 1, further comprising correcting including storing the vector phase output at the second outputting and a relationship of phase difference between the vector phase and a real vector phase, and correcting the vector phase by addition or subtraction of the phase difference to/from the vector phase based on the relationship.

5. A phase detection method comprising:
determining which of six continuous sections, first to sixth sections, in which magnitude correlation of a signal amplitude value of an input three-phase signal of R-phase, S-phase, and T-phase takes a R-phase value>T-phase value>S-phase value, a R-phase value>S-phase value>T-phase value, a S-phase value>R-phase value>T-phase value, a S-phase value>T-phase value>R-phase value, a T-phase value>S-phase value>R-phase value, and a T-phase value>R-phase value>S-phase value, the section is;
calculating the first section by ((R-phase value)−(T-phase value))/((R-phase value)−(S-phase value)), the second section by ((S-phase value)−(T-phase value))/((R-phase value)−(T-phase value)), the third section by ((S-phase value)−(R-phase value))/((S-phase value)−(T-phase value)), the fourth section by ((T-phase value)−(R-phase value))/((S-phase value)−(R-phase value)), the fifth section by ((T-phase value)−(S-phase value))/((T-phase value)−(R-phase value)), the sixth section by ((R-phase value)−(S-phase value))/((T-phase value)−(S-phase value)), to obtain a normalized amplitude value normalized in each section; and
second outputting including multiplying the normalized amplitude value of the first to the sixth sections, respectively, by a phase of 60°, to calculate a phase value by adding phases of 30°, 90°, 150°, 210°, 270°, and 330°, respectively, to the multiplied values of the first to the sixth sections, and when the phase value of the sixth section is equal to or larger than 360°, obtaining a phase value by subtracting the phase of 360° from the phase value, and outputting a vector phase for one cycle.

6. The phase detection method according to claim 5, further comprising correcting including storing the vector phase output at the second outputting and a relationship of phase difference between the vector phase and a real vector phase, and correcting the vector phase by addition or subtraction of the phase difference to/from the vector phase based on the relationship.

7. A phase detecting apparatus comprising:
a section determining unit that determines which of a plurality of continuous sections having different magnitude correlation of signal amplitude of each phase a section is, based on an input signal amplitude value of a plurality of phases;
an amplitude normalizing unit that performs predetermined subtraction with respect to the signal amplitude between respective phases for each section determined by the section determining unit, to obtain a normalized amplitude value normalized in the section, using the subtraction result; and
a phase outputting unit that converts the normalized amplitude value obtained by the amplitude normalizing unit to a vector phase for one cycle based on a predetermined phase, and outputs the vector phase corresponding to the section determined by the section determining unit.

8. The phase detecting apparatus according to claim 7, wherein, when a starting point and an end point of the vector phase is included in the section, the phase outputting unit converts the vector phase value after the end point to a vector phase value after the starting point.

9. The phase detecting apparatus according to claim 7, wherein the amplitude normalizing unit outputs a value obtained by dividing a value as a result of a second subtraction, at which the subtraction result between signal amplitudes of respective phases in the section has a linear characteristic, by a value as a first subtraction result, at which the subtraction result between signal amplitudes of respective phases in the section has approximately a flat characteristic, as a normalized amplitude value.

10. The phase detecting apparatus according to claim 7, further comprising a correcting unit that stores the vector phase output by the phase outputting unit and a relationship of phase difference between the vector phase and a real vector phase, and corrects the vector phase by addition or subtraction of the phase difference to/from the vector phase based on the relationship.

11. A phase detecting apparatus comprising:
a section determining unit that determines which of six continuous sections, first to sixth sections, in which magnitude correlation of a signal amplitude value of an input three-phase signal of R-phase, S-phase, and T-phase takes a R-phase value>T-phase value>S-phase value, a R-phase value>S-phase value>T-phase value, a S-phase value>R-phase value>T-phase value, a S-phase value>T-phase value>R-phase value, a T-phase value>S-phase value>R-phase value, and a T-phase value>R-phase value>S-phase value, the section is;
an amplitude normalizing unit that calculates the first section by ((R-phase value)−(T-phase value))/((R-phase value)−(S-phase value)), the second section by ((S-phase value)−(T-phase value))/((R-phase value)−(T-phase value)), the third section by ((S-phase value)−(R-phase value))/((S-phase value)−(T-phase value)), the fourth section by ((T-phase value)−(R-phase value))/((S-phase value)−(R-phase value)), the fifth section by ((T-phase value)−(S-phase value))/((T-phase value)−(R-phase value)), the sixth section by ((R-phase value)−(S-phase value))/((T-phase value)−(S-phase value)), to obtain a normalized amplitude value normalized in each section; and
a phase outputting unit that multiplies the normalized amplitude value of the first to the sixth sections, respectively, by a phase of 60°, to calculate a phase value by adding phases of 30°, 90°, 150°, 210°, 270°, and 330°, respectively, to the multiplied values of the first to the sixth sections, and when the phase value of the sixth section is equal to or larger than 360°, obtains a phase value by subtracting the phase of 360° from the phase value, and outputs a vector phase for one cycle.

12. The phase detecting apparatus according to claim 11, further comprising a correcting unit that stores the vector phase output by the phase outputting unit and a relationship of phase difference between the vector phase and a real vector phase, and corrects the vector phase by addition or subtraction of the phase difference to/from the vector phase based on the relationship.

* * * * *